United States Patent
Huang et al.

(10) Patent No.: US 6,593,816 B2
(45) Date of Patent: Jul. 15, 2003

(54) BALANCED INPUT/OUTPUT FILTER CIRCUIT AND DEVICE

(75) Inventors: Jun-Zhe Huang, Kaohsiung Hsien (TW); Pao-You Yen, Kaohsiung Hsien (TW)

(73) Assignee: Darfon Electronics Corp., Kweishan Taoyuan (TW)

( * ) Notice: Subject to any disclaimer, the term of this patent is extended or adjusted under 35 U.S.C. 154(b) by 0 days.

(21) Appl. No.: 09/991,068

(22) Filed: Nov. 15, 2001

(65) Prior Publication Data

US 2002/0060609 A1 May 23, 2002

(30) Foreign Application Priority Data

Nov. 21, 2000 (TW) ........................................ 89124629 A

(51) Int. Cl.[7] ................................................. H03L 7/00
(52) U.S. Cl. ..................... 331/2; 331/107 A; 333/167; 333/175
(58) Field of Search .................. 334/64, 67; 331/2, 331/107 A; 333/167, 175, 196, 184, 185, 202, 204, 206

(56) References Cited

U.S. PATENT DOCUMENTS 6,133,809 A * 10/2000 Tomohiro et al. ........... 333/185

FOREIGN PATENT DOCUMENTS

JP          08250905 A  *  9/1996

* cited by examiner

Primary Examiner—Robert Pascal
Assistant Examiner—Kimberly E Glenn
(74) Attorney, Agent, or Firm—Ladas & Parry

(57) ABSTRACT

The present invention provides a balanced input/output filter device comprising two resonators, a pair of coupling capacitors, a positive input terminal and a negative input terminal, and a positive output terminal and a negative output terminal. Both sides of one resonator are serial connected to spiral-type inductors on the other metal layers, and both sides of the other resonator are serial connected to parallel-type capacitors on the other metal to layers. The coupling capacitors couple between the spiral-type inductors and the parallel-type capacitors respectively, and the output and input terminals are coupled to the spiral-type inductors and parallel-type capacitors respectively, which are coupled to the resonators.

7 Claims, 6 Drawing Sheets

BALANCED INPUT/OUTPUT FILTER CIRCUIT AND DEVICE

BACKGROUND OF THE INVENTION

1. Field of the Invention

The present invention relates in general to a balanced input/output filter device. In particular, the present invention relates to a ceramic-laminated planar filter comprising balanced input/output terminals.

2. Description of the Related Art

Generally speaking, surface acoustic wave filters are important band-pass filter devices in communications. Although the surface acoustic wave filters have good frequency responses in rejection band, they have disadvantages of cost and size. Therefore, laminated planar filters are employed to decrease the size of products and the cost of production.

A balanced-input-output configuration of laminated planar filters suitable for next-generation super-compact portable telephones is disclosed in 1999 IEEE MTT-S Digest from pages 1143 to 1146. FIG. 1 depicts an equivalent circuit diagram of a conventional two-order balanced input/output band-pass filter. A conventional two-order balanced input/output band-pass filter comprises a positive input terminal 111 and a negative input terminal 112, a positive output terminal 121 and a negative output terminal 122, and ceramic resonators 13 and 14. The ceramic resonators 13 and 14 are coupled between the positive input terminal 111 and a negative input terminal 112 and between the positive output terminal 121 and a negative output terminal 122, respectively. In addition, a conventional two-order balanced input/output band-pass filter further comprises six coupling capacitors 15, 16, 17, 18, 19, and 20. Capacitors 15, 19, 17 are coupled between the positive input terminal 111 and the positive output terminal 121, and capacitors 16, 20, 18 are coupled between the negative input terminal 112 and the negative output terminal 122.

FIG. 2 depicts the ceramic-laminated planar structure of the circuit in FIG. 1. As shown in FIG. 2, parallel metal layers (15~20) constitute capacitor structures, and resonators are composed by transmission lines 13 and 14. The transmission lines 13 and 14 are series-connected to the parallel metal layers and are shorter than a quarter wavelength.

FIG. 3 depicts a frequency response plot of the ceramic laminated planar structure in FIG. 2. As shown in FIG. 3, the frequency response of the rejection band of conventional two-order balanced input/output band-pass filter is poor. Therefore, the conventional balanced input/output band-pass filter cannot eliminate signals with undesired frequency.

To overcome this disadvantage, the conventional method is to add the orders of the conventional balanced input/output band-pass filter. Therefore, the conventional two-order balanced input/output band-pass filter circuit must add more ceramic resonators and coupling capacitors to improve the effect of filtering noise.

However, the approach mentioned above uses more elements. Therefore, the cost of fabricating and the size of filter will both increase, which will limit the design of communication apparatus. Moreover, the increase in quantity of elements used increases the insertion loss, so the intensity of the signal to be transmitted will be decreased, worsening the efficacy of the communication apparatus.

SUMMARY OF THE INVENTION

The object of the present invention is to provide a balanced input/output filter circuit, under the configuration of a two-order balanced input/output bandpass filter circuit. In the present invention, both sides of the ceramic resonators are serially connected to a pair of inductors and capacitors, respectively. Therefore, the intensity of the signal in rejection band will attenuate effectively without increasing elements of the circuit; moreover, the purpose of decreasing insertion loss and the size of the units will be achieved.

To achieve the above-mentioned object, the present invention provides a balanced input/output filter device. The balanced input/output filter device according to the present invention comprises two resonators, a pair of coupling capacitors, a positive input terminal and a negative input terminal, and a positive output terminal and a negative output terminal.

Both sides of one resonator are serial connected to spiral-type inductors on the other metal layers, and both sides of the other resonator are serial connected to parallel-type capacitors on the other metal layers. The coupling capacitors couple between the spiral-type inductors and the parallel-type capacitors respectively, and the output and input terminals are coupled to the spiral-type inductors and parallel-type capacitors respectively, which are coupled to the resonators.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Figure 4:
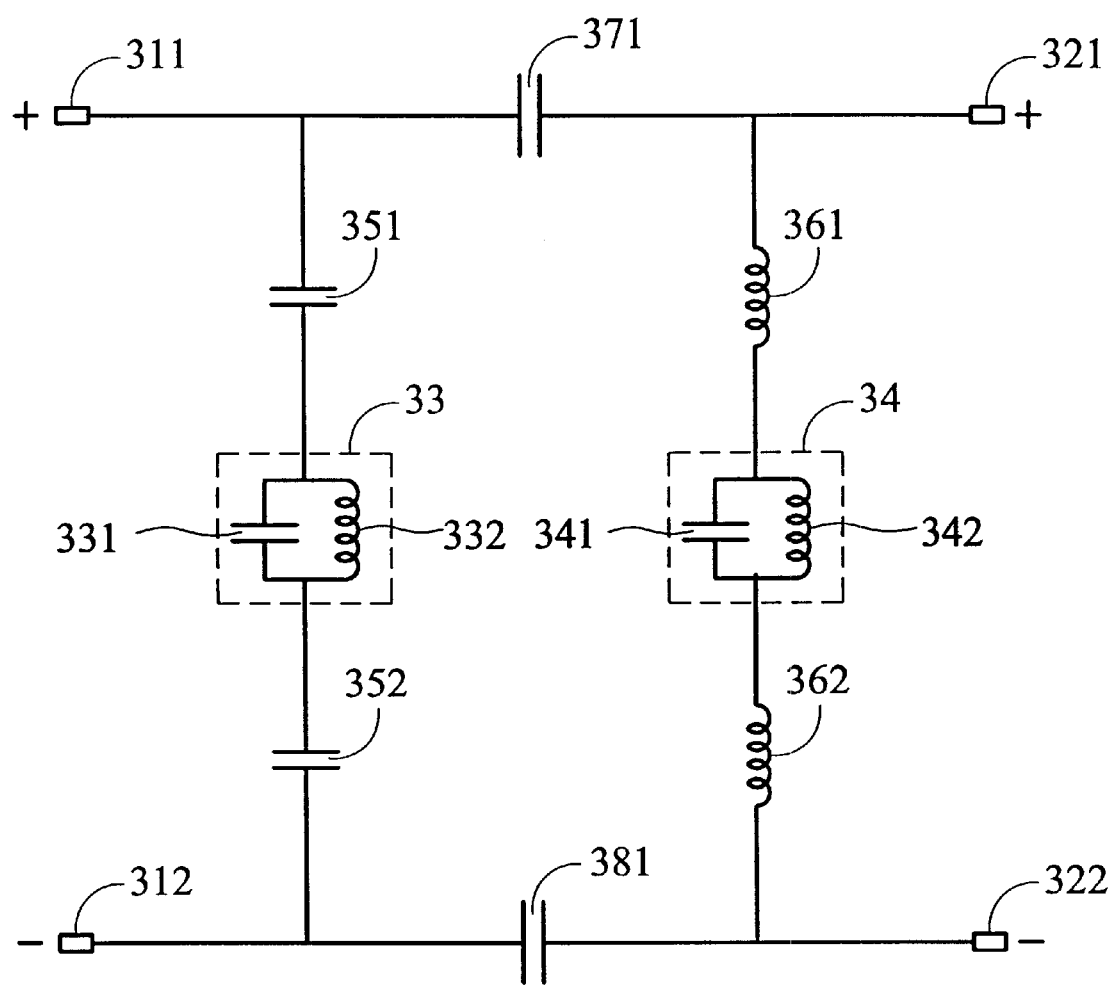
FIG. 4 depicts an equivalent circuit diagram of a two-order balanced input/output band-pass filter according to the embodiment of the present invention.
Figure 5:
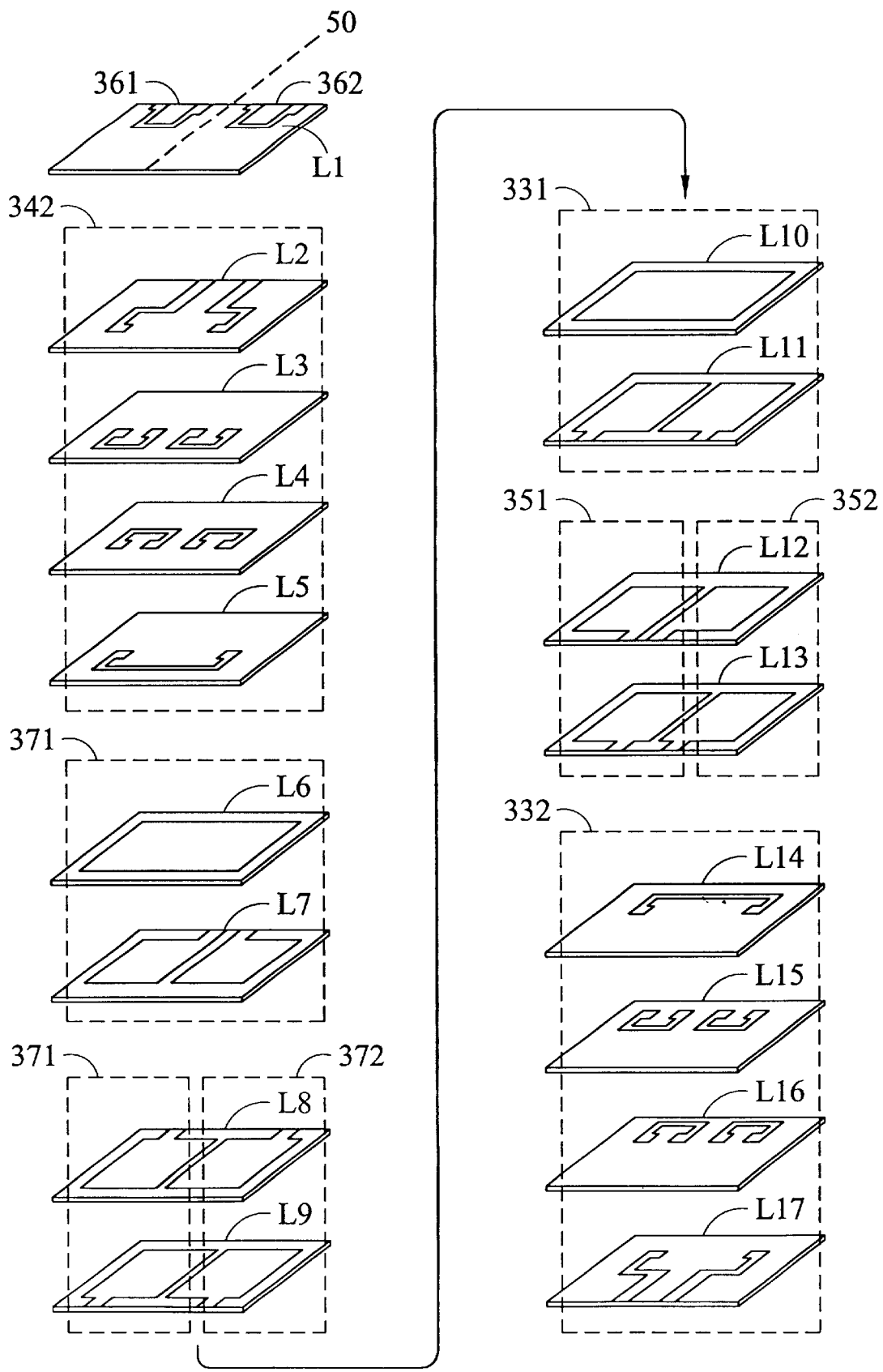
FIG. 5 depicts the ceramic laminated planar structure of the circuit according to the embodiment of the present invention.

FIG. 4 depicts an equivalent circuit diagram of a two-order balanced input/output band-pass filter according to the embodiment of the present invention. The elements of two-order balanced input/output band-pass filter circuit according to the embodiment of the present invention are described below, and its laminated planar structure is shown in FIG. 5.

A positive input terminal 311 and a negative input terminal 312 receive balanced signal from outside. A positive output terminal and a negative output terminal output the balanced signal converted by the filter of the present embodiment. The balanced signal is comprised of two signals having the same intensity and 180° phase difference.

In the present embodiment, the ceramic resonators 33 and 34 are composed of capacitor 331 and inductor 332 with parallel connection and capacitor 341 and inductor 342 with parallel connection, respectively. However, the resonator may be another type of conventional resonator. In addition, the sides of resonator 33 are coupled to capacitor 351 and 352 respectively, and both sides of resonator 34 are coupled to inductors 361 and 362 respectively. Referring to FIG. 5, with the symmetry of structure, each capacitor and inductor are symmetric with the symmetry line 50.

Coupling capacitor 371 is coupled between the connection point of positive input terminal 311 and capacitor 351 and the connection point of the positive output terminal 321 and inductor 361. Coupling capacitor 372 is coupled between the connection point of negative input terminal 312 and capacitor 352 and the connection point of the negative output terminal 322 and inductor 362.

Here, the positive input terminal 311 and the negative input terminal 312 compose a balanced input terminal, and the positive output terminal 321 and the negative output terminal 322 compose a balanced output terminal.

FIG. 5 depicts the ceramic-laminated planar structure of the circuit according to the embodiment of the present invention. Here, each layer is made of dielectric materials, such as barium (Ba), neodymium (Nd), and titanium (Ti). The patterns on the layers are defined by printing metal materials, such as palladium (Pd), on the dielectric layers.

Figure 7:
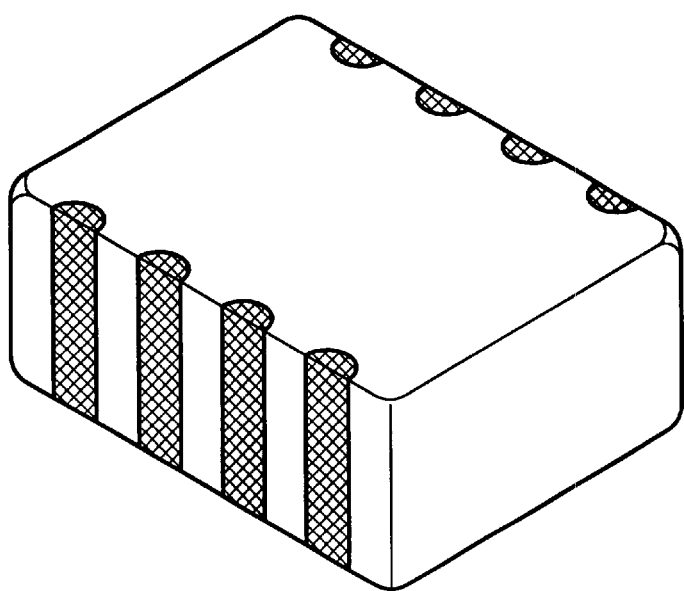
FIG. 7 depicts the outward appearance of the ceramic filter according to the embodiment of the present invention.

Ceramic filters filter signals by coupling electromagnetic wave in each layer. Inductor layouts are formed with spiral metal layers, and capacitor layouts are formed with parallel metal layers. As shown in FIG. 5, dielectric layers L1~L5 and L14~L17 are inductive dielectric layers, dielectric layers L6~L15 are capacitance dielectric layers. After the patterns of each layer are defined, the ceramic filter as shown in FIG. 7 is formed by Multi-layer Low Temperature Co-fired Ceramic technology (LTCC). The related description of manufacturing process is disclosed in Taiwan patent number 340998.

In FIG. 5, the pattern on the dielectric layers L1 is axial symmetry with symmetry line 50, as are the other layers. When the ceramic filters according to the present invention convert a balanced signal, the voltage on each layer at symmetry line 50 is zero. Therefore, phase neutralization of the balanced signal is avoided, and insertion loss of the filter is decreased.

Accordingly, the intensity of the signal in rejection band of the ceramic filter according to the present invention will attenuate effectively without increasing the numbers of resonators. Therefore, size increase of the filter will be avoided by not adding unnecessary electrical elements. Moreover, phase neutralization of the balanced signal is avoided, and the insertion loss of the filter is decreased.

Figure 1:
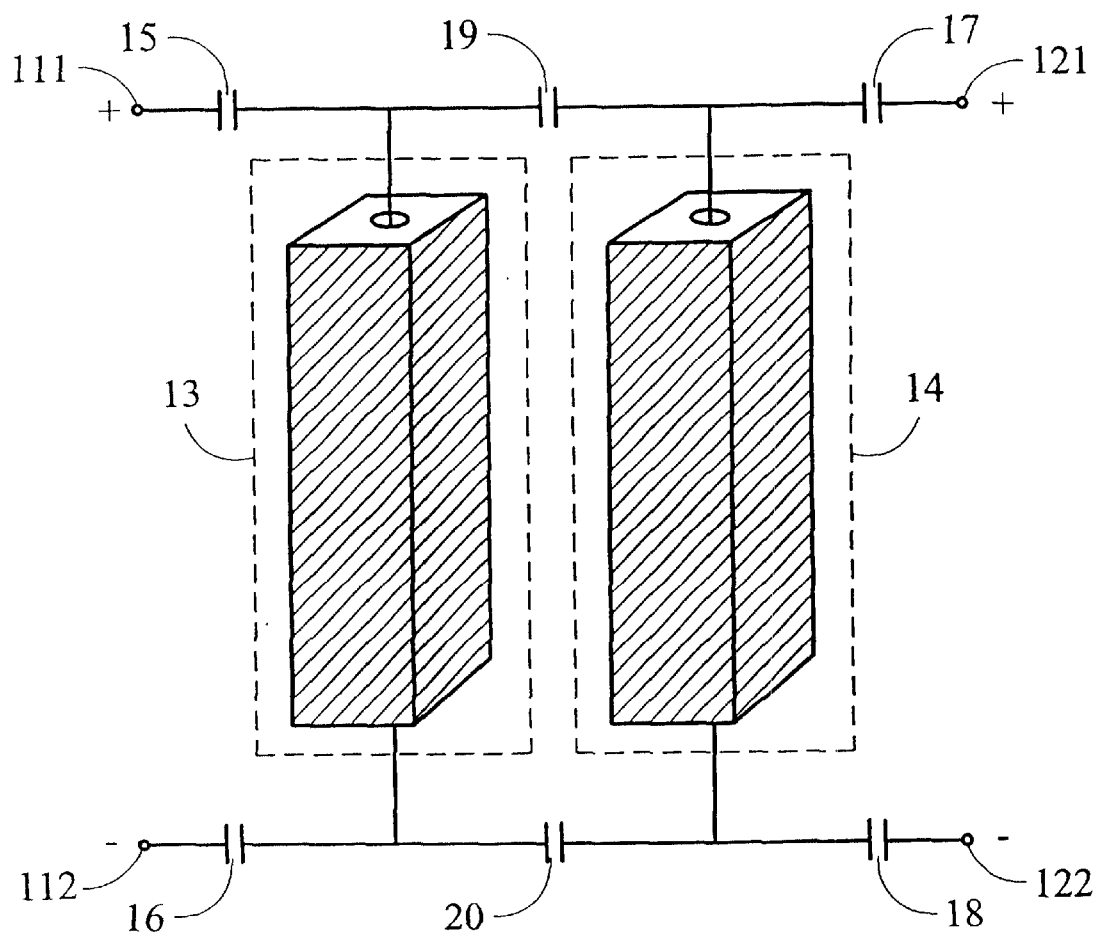
FIG. 1 depicts an equivalent circuit diagram of a conventional two-order balanced input/output band-pass filter.
Figure 2:
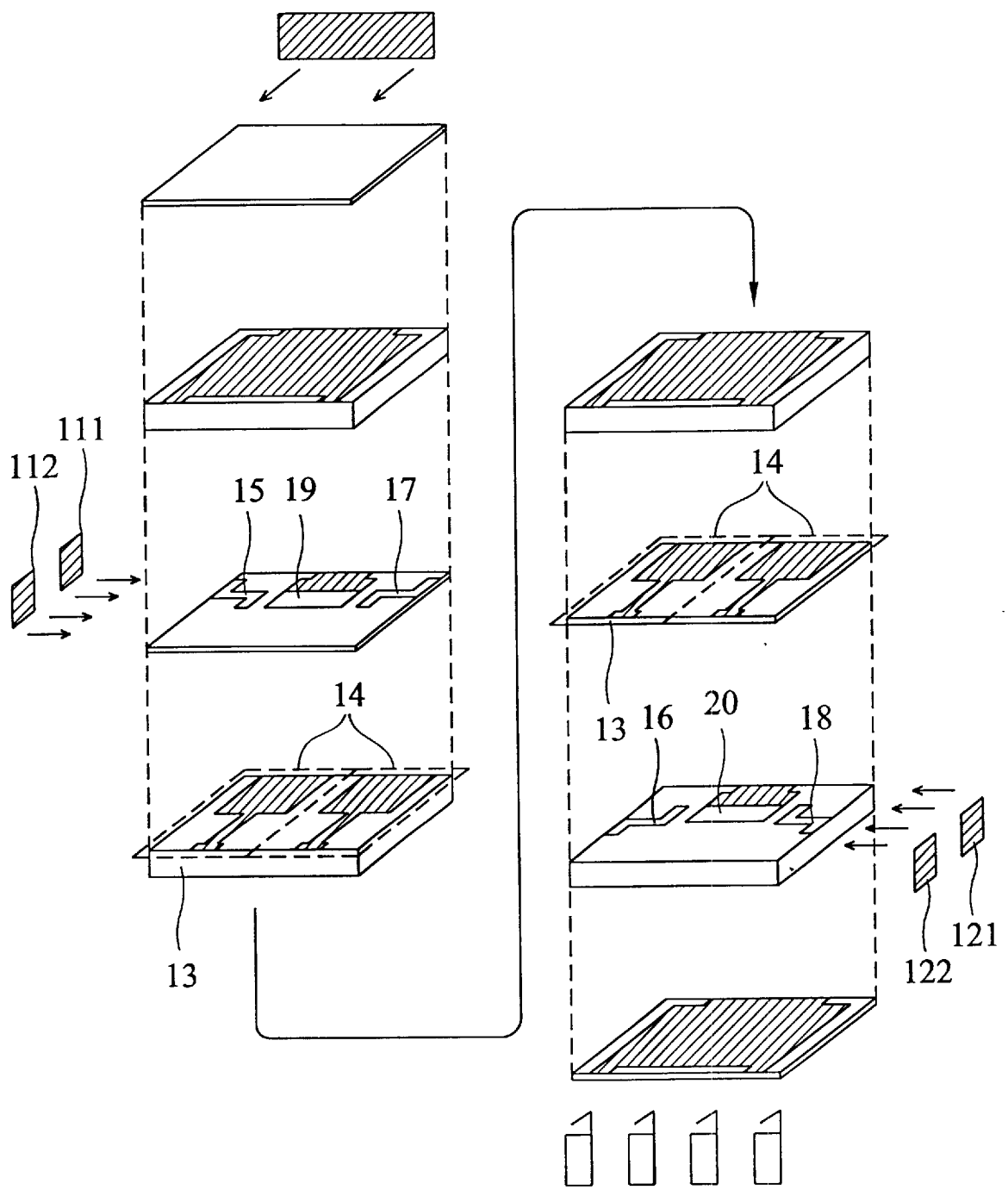
FIG. 2 depicts the ceramic laminated planar structure of the circuit in FIG. 1.
Figure 3:
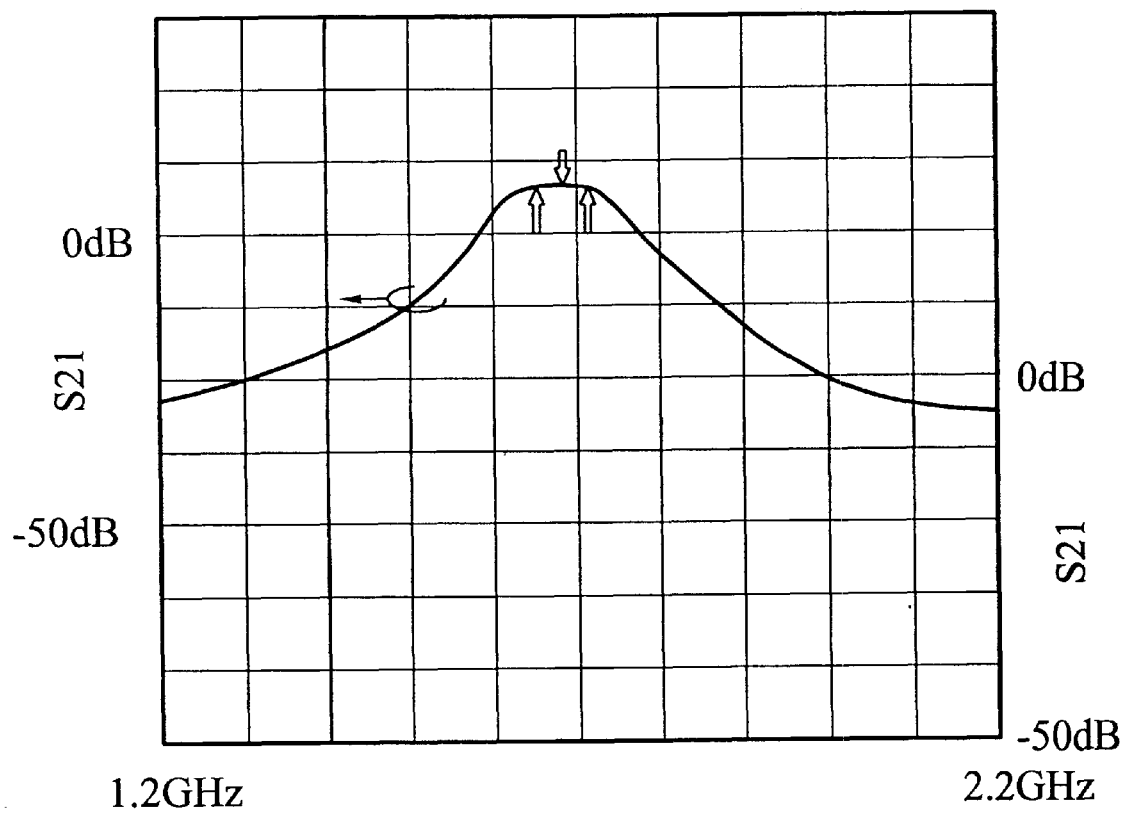
FIG. 3 depicts a frequency response plot of the ceramic laminated planar structure in FIG. 2.
Figure 6:
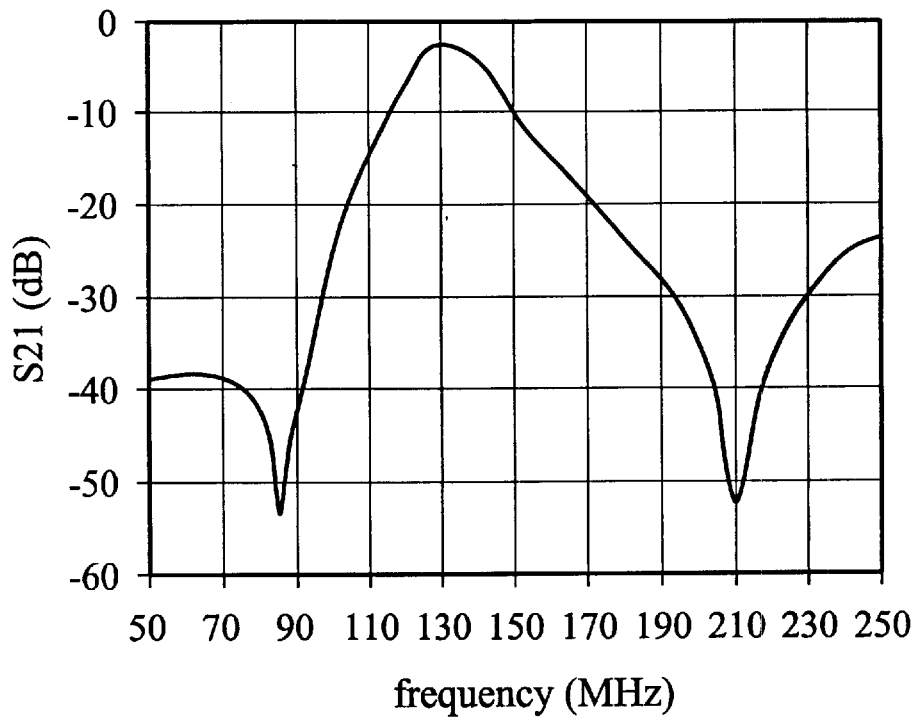
FIG. 6 depicts a frequency response plot of the ceramic laminated planar structure in FIG. 5.

FIG. 6 depicts a frequency response plot of the ceramic laminated planar structure in FIG. 5. Compared with FIG. 3, the two-order balanced input/output band-pass filter according to the present invention has better frequency response, because both sides of the resonators 33 and 34 of the ceramic filter according to the present invention are connected to capacitors 351, 352 and inductors 361, 362 respectively. Therefore, attenuated poles are generated on both sides of the rejection band, so the signal will attenuate effectively in specific frequency bands. It is noted that the frequency of the attenuated poles can be modified by changing the capacitors 351 and 352 and inductors 361 and 362, and the value of the resonators may be changed according to the input impedance. Therefore, the design of the invention is suitable for use in various kinds of communication apparatus with different input/output impedance.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the append claims when interpreted in accordance with the breadth of which they are fairly, legally, and equitably entitled.

What is claimed is:

1. A balanced input/output filter circuit, comprising:
   a positive input terminal and a negative input terminal;
   a first resonator;
   a first coupling capacitor and a second coupling capacitor, the first coupling capacitor coupled between the positive input terminal and the first resonator, and the second coupling capacitor coupled between the negative input terminal and the first resonator;
   a positive output terminal and a negative output terminal;
   a second resonator;
   a first inductor and a second inductor, the first inductor coupled between the positive output terminal and the second resonator, and the second inductor coupled between the negative output terminal and the second resonator;
   a third coupling capacitor is coupled between the positive input terminal and the positive output terminal; and
   a fourth coupling capacitor coupled between the negative input terminal and the negative output terminal.

2. The balanced input/output filter circuit as claimed in claim 1, wherein the balanced input/output filter circuit is a ceramic balanced input/output band-pass filter.

3. The balanced input/output filter circuit as claimed in claim 2, wherein the first resonator and the second resonator are ceramic resonators.

4. The balanced input/output filter circuit as claimed in claim 3, wherein the first resonator further comprises:
   a fifth capacitor, which is coupled between the first capacitor and the second capacitor; and
   a third inductor, which is parallel connected with the fifth capacitor.

5. The balanced input/output filter circuit as claimed in claim 4, wherein the second resonator further comprises:
   a fourth inductor, which is coupled between the first inductor and the second inductor; and
   a sixth capacitor, which is parallel connected with the fourth inductor.

6. The balanced input/output filter circuit as claimed in claim 5, wherein the positive input terminal and the negative input terminal compose a balanced input terminal.

7. The balanced input/output filter circuit as claimed in claim 6, wherein the positive output terminal and the negative output terminal compose a balanced output terminal.

* * * * *